US009638858B2

(12) United States Patent
Luo et al.

(10) Patent No.: US 9,638,858 B2
(45) Date of Patent: May 2, 2017

(54) ATHERMAL HYBRID OPTICAL SOURCE

(71) Applicant: Oracle International Corporation, Redwood City, CA (US)

(72) Inventors: Ying L. Luo, San Diego, CA (US); Xuezhe Zheng, San Diego, CA (US); Ashok V. Krishnamoorthy, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 277 days.

(21) Appl. No.: 14/451,105

(22) Filed: Aug. 4, 2014

(65) Prior Publication Data

US 2016/0170141 A1    Jun. 16, 2016

(51) Int. Cl.
*G02B 6/12* (2006.01)
*G02B 6/124* (2006.01)
*H01S 5/14* (2006.01)
*G02B 6/122* (2006.01)
*H01S 3/106* (2006.01)
*H01S 5/06* (2006.01)

(52) U.S. Cl.
CPC ............ *G02B 6/124* (2013.01); *H01S 5/141* (2013.01); *G02B 6/1228* (2013.01); *G02B 2006/12061* (2013.01); *G02B 2006/12104* (2013.01); *G02B 2006/12135* (2013.01); *H01S 3/106* (2013.01); *H01S 5/0612* (2013.01)

(58) Field of Classification Search
CPC ................ G02B 6/124; G02B 6/1228; G02B 2006/12061; G02B 2006/12104; G02B 2006/12135; H01S 5/141; H01S 5/0612; H01S 3/106

USPC .......................................................... 385/14
See application file for complete search history.

(56) References Cited

U.S. PATENT DOCUMENTS 5,093,876 A * 3/1992 Henry .................... G01D 5/268
                                                      385/28
5,799,118 A * 8/1998 Ogusu ................ G02B 6/12007
                                                      385/14

(Continued)

OTHER PUBLICATIONS

A.J. Zilkie et al.; Power-efficient III-V/Silicon external cavity DBR lasers, Optic Express, vol. 20, No. 21, 23456-23462, 2012.

(Continued)

*Primary Examiner* — Jerry Blevins
(74) *Attorney, Agent, or Firm* — Park, Vaughan, Fleming & Dowler LLP (57) ABSTRACT

A hybrid optical source that provides an optical signal having a wavelength (or a narrow band of wavelengths) is described. This hybrid optical source includes an optical amplifier (such as a III-V semiconductor optical amplifier) that is butt-coupled or vertically coupled to a silicon-on-insulator (SOI) platform, and which outputs an optical signal. The SOI platform includes an optical waveguide that conveys the optical signal. A temperature-compensation element included in the optical waveguide compensates for temperature dependence of the indexes of refraction of the optical amplifier and the optical waveguide. In addition, a reflector, adjacent to the optical waveguide after the temperature-compensation element, reflects a portion of the optical signal and transmits another portion of the optical signal that has the wavelength.

18 Claims, 6 Drawing Sheets

(56) References Cited

U.S. PATENT DOCUMENTS

| | | | |
|---|---|---|---|
| 2003/0077037 A1* | 4/2003 | Ovadia | G02B 6/124 385/37 |
| 2011/0227116 A1* | 9/2011 | Saito | H01L 31/103 257/98 |
| 2012/0155797 A1* | 6/2012 | Zhang | G02B 6/122 385/14 |

OTHER PUBLICATIONS

K. Nemoto et al; "Narrow spectral linewidth wavelength tunable laser with Si photonic-wire waveguide ring resonators" Group IV photonics, ThD4, 26-128, 2012.

N. Fujioka et al; "Compact and low power consumption hybrid integrated wavelength tunable laser module using silicon waveguide resonators," J. of Lightwave Technology vol. 28 No. 21, 3115-3120, 2010.

J-H Lee et al; "High power and widely tunable Si hybrid external-cavity laser for power efficient Si photonics WDM links" Optics Express vol. 22, No. 7, 7678-7685, 2014.

S. Lin et al; "Vertical-coupled high-efficiency tunable III-V-CMOS SOI hybrid external-cavity laser" Optics Express vol. 21, No. 26, 32425-32431, 2013.

S.S. Djordjevic et al; "CMOS-compatible, athermal silicon ring modulators clad with titanium ioxide" Optics Express vol. 21, No. 12, 13958-13968, 2013.

* cited by examiner

ATHERMAL HYBRID OPTICAL SOURCE

GOVERNMENT LICENSE RIGHTS

This invention was made with United States government support under Agreement No. HR0011-08-9-0001 awarded by DARPA. The United States government has certain rights in the invention.

BACKGROUND

Field

The present disclosure generally relates to the design of a hybrid optical source. More specifically, the present disclosure relates to the design of a hybrid optical source with reduced temperature sensitivity.

Related Art

Optical interconnects or links based on silicon photonics have the potential to alleviate inter-chip communication bottlenecks in high-performance computing systems that include multiple processor chips and memory chips. This is because, relative to electrical interconnects, optical interconnects offer significantly improved: bandwidth, density, power consumption, latency, and range.

In order to make a very low power (for example, less than 1 pJ/bit) optical interconnect, a power-efficient optical source, such as a semiconductor laser or a laser source, that is compatible with silicon-on-insulator (SOI) platforms is highly desirable. However, silicon cannot efficiently emit light because of the fundamental limitations of its indirect bandgap and low mobility. Consequently, one approach for implementing silicon lasers is to integrate discrete III-V semiconductor optical amplifiers with silicon-based optical devices in a hybrid optical source. In these approaches, the III-V semiconductor provides the optical gain (and, thus, the initial light), and the silicon-based optical devices achieve lasing-wavelength control by providing a narrow-band optical filter.

For thick SOI platforms, etched grating-based distributed Bragg reflectors (DBR) are typically used as wavelength-selective optical devices. Because of the thick silicon core (and, thus, the large optical mode size), the DBR can usually be butt-coupled with commercial III-IV laser diodes without excessive optical-mode-mismatch loss. However, there are often problems associated with this configuration. In particular, in order to transport light out of the laser, the DBR typically is used as a partial reflector, which simultaneously controls the total mirror loss of the external laser and the output/transmission into the silicon optical waveguide. Moreover, because of transmission loss, the etched gratings usually are very shallow so that they represent small perturbations. Consequently, in order to obtain sufficient reflectance, the total length of the DBR is typically on the order of a hundred microns. With this total length of the DBR, the whole external optical cavity is usually longer than a few millimeters. Cavities this long usually result in a dense longitudinal mode spacing, which often results in frequent optical-mode hopping under un-cooled operating conditions. Furthermore, laser-wavelength control in this configuration can be very difficult. In particular, currently an efficient tuning mechanism for a DBR having a long total length is unavailable. Therefore, the hybrid optical source typically needs to be mounted on a costly, bulky (usually several millimeters in size) thermoelectric cooler in order to achieve stabilized lasing.

Alternatively, for a thin (usually sub-micron) SOI platform, silicon-based ring resonators can be used as narrow-band filters for lasing-wavelength control. Because the substrates in such SOI platforms are usually thin, this type of hybrid optical source is typically very compact and can be easily tuned, e.g., with built-in thermal heaters. However, silicon-based ring resonators have a short free spectrum range (FSR), so there are many repeated transmission/reflection maxima or minima in every FSR in the frequency domain. Moreover, in order to ensure single wavelength lasing, the 3 dB gain-spectrum range of a semiconductor laser diode is usually around 20-30 nm. Because the FSR of the ring reflector is typically designed to be larger than this gain-spectrum range, the silicon-based ring resonator typically has a radius below 5 um. These small features often increase the bending loss, and fabricating them often involves advanced lithography techniques that increase the cost of the hybrid optical source.

Hence, what is needed is an optical source without the problems described above.

SUMMARY

One embodiment of the present disclosure provides an integrated circuit having: a substrate, a buried-oxide layer disposed on the substrate, and a semiconductor layer disposed on the buried-oxide layer. The semiconductor layer includes: an optical waveguide, having a first edge and a second edge, which conveys an optical signal; and a reflector, optically coupled to the optical waveguide between the first edge and the second edge, which reflects a portion of the optical signal and transmits another portion of the optical signal. Furthermore, the integrated circuit includes a temperature-compensation element, optically coupled to the optical waveguide between the first edge and the second edge, which compensates for a temperature dependence of an index of refraction of the optical waveguide.

For example, the reflector may include a distributed feedback Bragg reflector having two distributed Bragg reflectors separated by another optical waveguide with an optical path length that provides a phase shift of one-quarter of a fundamental wavelength of the optical signal. Moreover, the integrated circuit may include a heater, thermally coupled to the reflector, which thermally tunes the reflector. Furthermore, the reflector may be side-coupled to the optical waveguide.

Additionally, the temperature-compensation element may be included in a portion of the optical waveguide. In the portion, the optical waveguide may have a narrower width than in a remainder of the optical waveguide. Moreover, the portion may include a titanium dioxide cladding layer.

Figure 1:
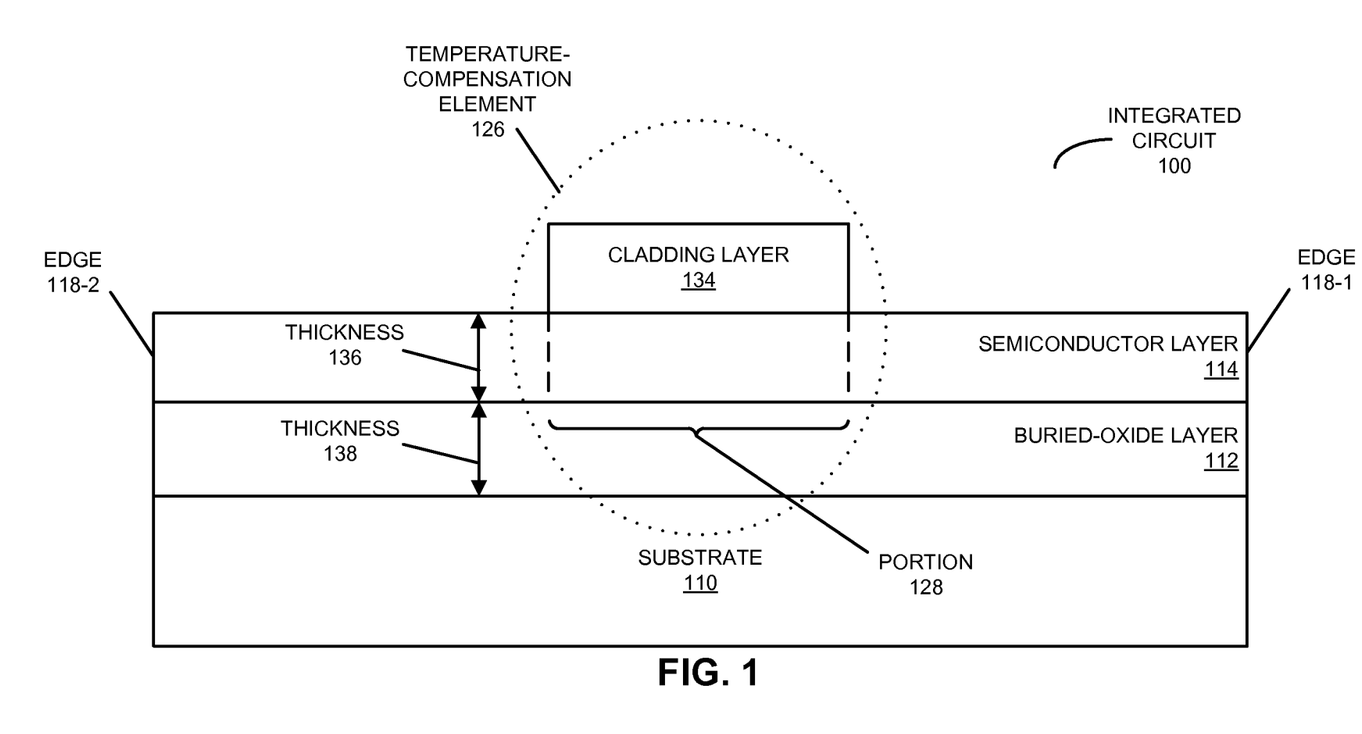
FIG. 1 is a block diagram illustrating a side view of an integrated circuit in accordance with an embodiment of the present disclosure.
Figure 3:
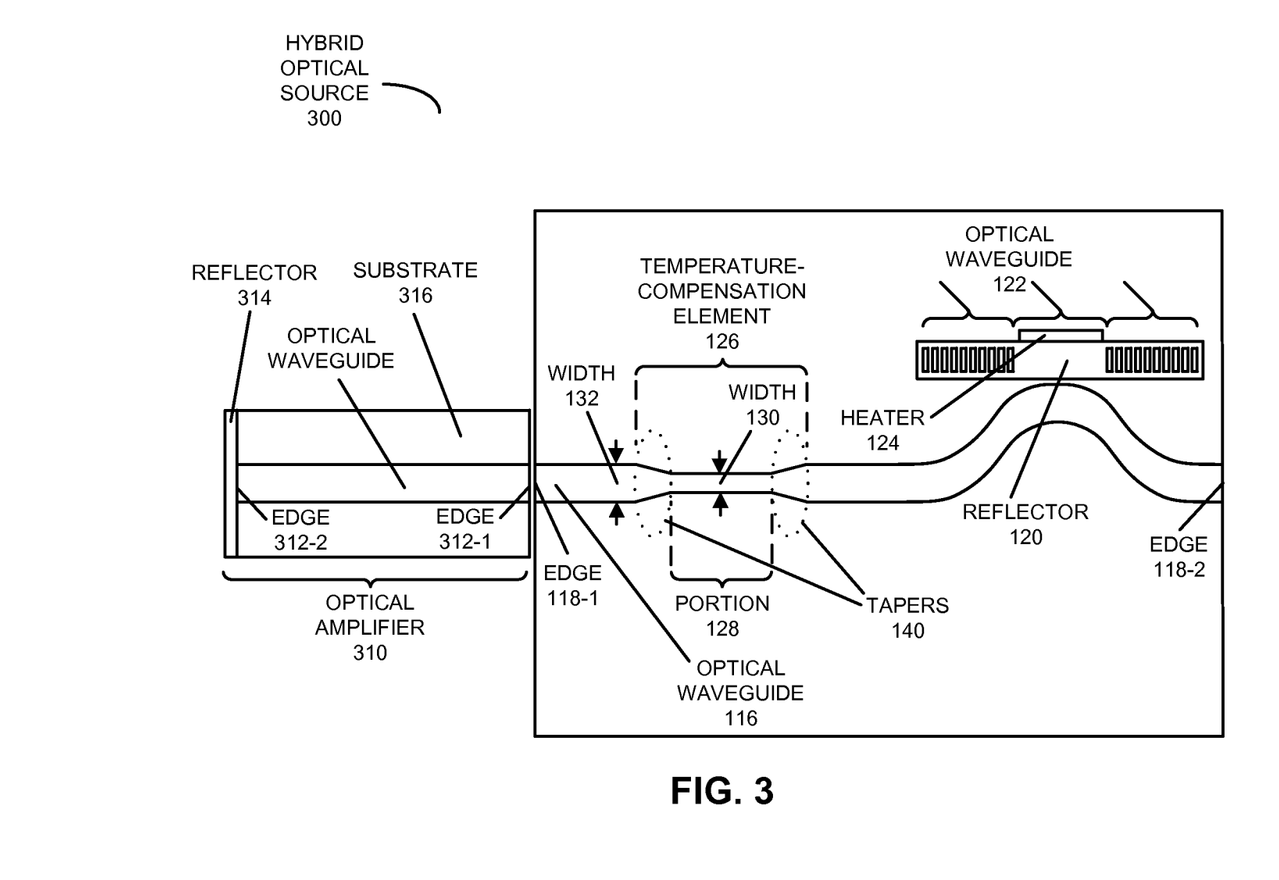
FIG. 3 is a block diagram illustrating a top view of a hybrid optical source that includes the integrated circuit of FIGS. 1 and 2 in accordance with an embodiment of the present disclosure.

In some embodiments, the integrated circuit includes an optical amplifier, having a third edge and a fourth edge, which provides the optical signal, where the third edge is optically coupled to the first edge. The optical amplifier may include another reflector (such as a mirror) optically coupled to the fourth edge, and the optical amplifier may be disposed on another substrate that is different than the substrate. For example, the optical coupling of the third edge and the first edge may include: edge coupling (such as facet-to-facet optical coupling), vertical coupling (such as a vertical-angled technique using an angled-facet output on optical amplifier 310 and grating couplers on integrated circuit 100), and/or optical proximity communication (such as using reflective mirrors).

Note that the temperature-compensation element may compensate for a temperature dependence of an index of refraction of the optical amplifier. In addition, note that the other substrate may include a III-V semiconductor, and the substrate may include silicon, the buried-oxide layer may include silicon dioxide, and the semiconductor layer may include silicon. Thus, the substrate, the buried-oxide layer and the semiconductor layer may constitute a silicon-on-insulator platform.

Another embodiment provides a hybrid optical source that includes the integrated circuit and the optical amplifier.

Another embodiment provides a system that includes: a processor, memory, and the hybrid optical source.

Another embodiment provides a method for providing an optical signal having a wavelength, which may be performed by the hybrid optical source. During operation, the optical amplifier outputs the optical signal having a range of wavelengths. This optical signal is optically coupled to the integrated circuit. Then, the optical waveguide in the integrated circuit conveys the optical signal. Moreover, the temperature-compensation element in the integrated circuit compensates for the temperature dependence of the indexes of refraction of the optical waveguide and the optical amplifier, where the temperature-compensation element is included in a portion of the optical waveguide. Furthermore, a reflector, adjacent to the optical waveguide and after the temperature-compensation element in the integrated circuit, reflects a portion of the optical signal and transmits another portion of the optical signal, where the portion and the other portion have the wavelength.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of an integrated circuit, a hybrid optical source that includes the integrated circuit, a system that includes the hybrid optical source, and a method for providing an optical signal having a wavelength (or a narrow band of wavelengths) are described. This hybrid optical source includes an optical amplifier (such as a III-V semiconductor optical amplifier) that is butt-coupled or vertically coupled to a silicon-on-insulator (SOI) platform, and which outputs an optical signal. The SOI platform includes an optical waveguide that conveys the optical signal. A temperature-compensation element included in the optical waveguide compensates for temperature dependence of the indexes of refraction of the optical amplifier and the optical waveguide. In addition, a reflector, adjacent to the optical waveguide after the temperature-compensation element, reflects a portion of the optical signal and transmits another portion of the optical signal that has the wavelength.

In this way, the hybrid optical source can provide a compact laser source with a narrow lasing linewidth and low power consumption that is compatible with a silicon-on-insulator (SOI) platform. In addition, the lasing wavelength of the hybrid optical source can be easily tuned, and the temperature dependence of the lasing wavelength is significantly reduced relative to existing laser sources. This hybrid optical source can facilitate high-performance optical interconnects for use in applications such as high-performance computing.

We now describe embodiments of the integrated circuit and the hybrid optical source. This hybrid optical source (or hybrid laser) is based on a side-coupled (via evanescent coupling) distributed feedback Bragg reflector in the SOI integrated circuit in conjunction with a gain or active medium on an optical-amplifier chip (such as a III-V semiconductor chip, which is sometimes referred to as a 'III-V optical-amplifier chip'). In particular, the distributed feedback Bragg reflector includes two approximately identical distributed Bragg reflectors (DBRs) coupled by a phase-shift section having an optical path length that results in a quarter-wave phase shift. This distributed feedback Bragg reflector provides the lasing mode selector. Moreover, a parallel or curved optical waveguide is placed adjacent to or beside the center of the optical waveguide in the distributed feedback Bragg reflector, and provides the input- and output-coupling optical waveguide. This hybrid optical source has a very narrow band or single-frequency lasing, and it can be used in conjunction with thick or thin SOI platforms. Furthermore, the hybrid optical source is very compact in size (the distributed feedback Bragg reflector may have a length less than 10 µm). Consequently, the hybrid optical source does not see the multiple free spectral ranges (FSRs) within the gain bandwidth, which can cause adverse effects such as mode hopping and less-controllable mode selection. In addition, the hybrid optical source includes a temperature-compensation element, such as a region or portion of an optical waveguide in the SOI integrated circuit that has a narrow width and titanium dioxide cladding (and, more generally, a material with a negative temperature dependence of its index of refraction), which compensates for the positive thermal shifts associated with the III-V optical-amplifier chip and the optical waveguide. Therefore, the hybrid optical source may have significantly reduced temperature dependence (i.e., so-called 'athermal' operation) even in the absence of cooling (and, more generally, temperature control).

Figure 2:
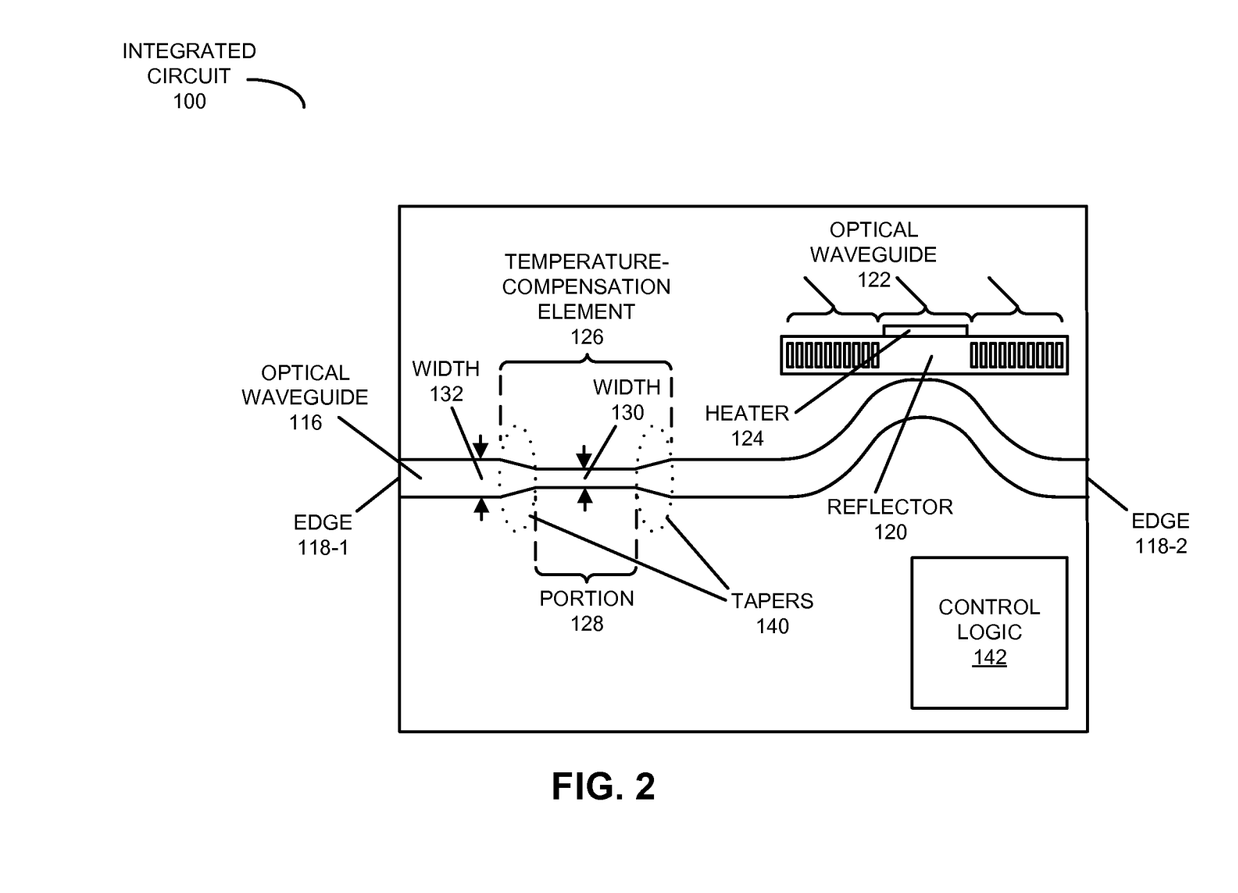
FIG. 2 is a block diagram illustrating a top view of an integrated circuit in accordance with an embodiment of the present disclosure.

FIG. 1 presents a block diagram of a side view of integrated circuit 100. This integrated circuit may include: a substrate 110, a buried-oxide layer 112 disposed on substrate 110, and a semiconductor layer 114 disposed on buried-oxide layer 112. As shown in FIG. 2, which presents a block diagram of a top view of integrated circuit 100, semiconductor layer 114 may include: an optical waveguide 116, having edges 118, which conveys an optical signal; and a reflector 120, optically coupled to optical waveguide 116 between edges 118, which reflects a portion of the optical signal and transmits another portion of the optical signal (both of which may have a narrow linewidth that includes a carrier wavelength). For example, as shown in FIG. 2, reflector 120 may include the distributed feedback Bragg reflector having two distributed Bragg reflectors separated by an optical waveguide 122 that has an optical path length that provides a phase shift of one-quarter of a fundamental wavelength of the optical signal (i.e., quarter-wave phase shift). Moreover, integrated circuit 100 may include a heater 124 (controlled by control logic 142), thermally coupled to reflector 120, which thermally tunes reflector 120. (Alternatively or additionally, reflector 120 may be electrically tuned, e.g., using injection tuning.) Furthermore, reflector 120 may be side-coupled to optical waveguide 116 (e.g., via evanescent coupling).

Additionally, integrated circuit 100 may include a temperature-compensation element 126, optically coupled to optical waveguide 116 between edges 118, which compensates for a temperature dependence of an index of refraction of optical waveguide 116 and, as discussed further below with reference to FIG. 3, a temperature dependence of an index of refraction of optical amplifier 310 in FIG. 3 (when optical amplifier 310 is present). Temperature-compensation element 126 may be included in a portion 128 of optical waveguide 116. For example, portion 128 may have a length between a few hundred microns and a millimeter. In this portion optical waveguide 116 may have a narrower width 130 than a width 132 of a remainder of optical waveguide 116. Referring back to FIG. 1, the portion may include a titanium dioxide cladding layer 134. While titanium dioxide is used as an illustrative example, a wide variety of material may be used in temperature-compensation element 126. In particular, temperature-compensation element 126 may include a material having an index of refraction with a negative temperature coefficient or a negative dependence on temperature.

FIG. 3 presents a block diagram of a top view of hybrid optical source 300. This hybrid optical source includes optical amplifier 310, having edges 312, which provides the optical signal, where edge 312-1 is optically coupled to edge 118-1. This optical amplifier may include another reflector 314 (such as a mirror) optically coupled to edge 312-2, and the optical amplifier may be disposed on substrate 316, which is different than substrate 110 (FIG. 1). For example, the optical coupling of the edges 118-1 and 312-1 may include: edge coupling or vertical coupling.

In an exemplary embodiment, substrate 316 may include a III-V semiconductor. More generally, optical amplifier 310 may include an active layer having a direct bandgap wavelength that exceeds that of silicon. Note that an optical waveguide on optical amplifier 310 may consist of: an upper cladding layer of lower index-of-refraction material (such as a first type of doped III-V semiconductor, e.g., n-type or p-type indium phosphide), a core layer of higher index-of-refraction material (such as indium gallium arsenide phosphide, aluminum indium gallium arsenide or quantum wells), a bottom cladding layer (such as a second type of doped III-V semiconductor, which may be different than the first type of doped III-V semiconductor, e.g., p-type or n-type indium phosphide), and a substrate (such as an undoped III-V semiconductor, e.g., indium phosphide).

Furthermore, substrate 110 (FIG. 1) may include silicon, buried-oxide layer 112 (FIG. 1) may include silicon dioxide, and semiconductor layer 114 (FIG. 1) may include silicon. Thus, substrate 110 (FIG. 1), buried-oxide layer 112 (FIG. 1) and semiconductor layer 114 (FIG. 1) may constitute an SOI platform. Consequently, integrated circuit 100 (FIGS. 1 and 2) is sometimes referred to as an SOI integrated circuit.

In an exemplary embodiment, the wavelength of the optical signal is between 1.1-1.7 µm. For example, hybrid optical source 300 may be a hybrid laser providing an optical signal having a fundamental or a carrier wavelength of 1.3 or 1.55 µm. Moreover, semiconductor layer 114 (FIG. 1) may have a thickness 136 (FIG. 1) that is less than 1 µm (such as 0.2-0.5 µm). For example, semiconductor layer 114 (FIG. 1) may have a thickness 136 (FIG. 1) of 0.3 µm. Furthermore, buried-oxide layer 112 (FIG. 1) may have a thickness 138 (FIG. 1) between 0.3 and 3 µm (such as 0.8 µm).

During operation, a III-IV gain medium in optical amplifier 310 may provide the initial light (such as an optical signal having a wide range of wavelengths), and reflector 314 (such as a silicon reflector) may provide mode selection. In order for an external optical-cavity laser to operate properly, the intrinsic optical feedback from the semiconductor-chip Fabry-Perot (FP) optical-cavity usually needs to be suppressed, so that it does not interfere with the external feedback. The FP optical-cavity effect of optical amplifier 310 can be reduced by applying an anti-reflection (AR) optical coating to chip facet or edge 312-1. At a minimum, the chip-facet reflectance may be 20 dB less than the external feedback.

Sometimes, even with the AR coating, the residual reflection from the AR-coated FP chip facet limits the stability, output power, and spectral quality of hybrid optical source 300 (FIG. 3), especially if the hybrid laser is tunable. In order to further reduce the reflection at the chip facet, the combination of an angled optical waveguide and an AR coating can be used to effectively remove most of the feedback from the internal-chip FP optical cavity. This single-angled-facet (SAF) gain chip or optical amplifier provides a superior structure for external optical-cavity lasers, in particular those that are broadband tunable. Therefore, the semiconductor diode in optical amplifier 310 may work as a reflective semiconductor optical amplifier (RSOA), with high reflection (HR) film on the front facet (i.e., reflector 314 at edge 312-2) and anti-reflection (AR) coating on the angled back facet (i.e., edge 312-1). Similarly, for integrated circuit 100, the interface at edge 118-1 with optical amplifier 310 may also be AR coated to ensure enough external optical feedback into optical amplifier 310. In this way, all the resonator behaviors from the individual chips may be eliminated, and the hybrid optical source or laser may lase at the external optical-cavity mode selected by integrated circuit 100. Note that integration between optical amplifier 310 and integrated circuit 100 may be achieved either with butt-coupling through a spot-size converter or with vertical coupling via a grating coupler (such as a diffraction grating and, more generally, a surface-normal optical coupler).

For most of the applications, it is desirable to have a single longitudinal mode (i.e., a single-frequency) laser and/or to be able to adjust the lasing wavelength. In order to accomplish this, a wavelength-selective feedback element in integrated circuit 100 may need to have a narrow bandwidth. The silicon reflector in this disclosure is a quarter-wave shifted side-coupled DBR (which is referred to as a 'distributed feedback Bragg reflector'). This distributed feedback Bragg reflector includes a straight optical waveguide with two approximately identical distributed Bragg reflectors connected at each end, and a curved or straight coupling optical waveguide that is placed beside the optical waveguide in the distributed feedback Bragg reflector. When separated by a phase-shifter, the two silicon distributed Bragg reflectors may form a strong optical resonator (i.e., high-Q with low loss), which may provide a narrow-band optical transmission to the nearby coupling optical waveguide. This sharp transmission can be converted to a reflection peak, so that the whole silicon feature (e.g., integrated circuit 100) becomes a narrow-band wavelength-selective feedback element to the external optical-cavity laser. As shown in FIG. 3, edge 118-1 of the coupling optical waveguide is optically coupled to optical amplifier 310 (e.g., the III-IV laser-diode light source), and edge 118-2 is the outlet of hybrid optical source 300.

In order to design the distributed feedback Bragg reflector to support a single high Q mode, the two distributed Bragg reflectors may be coherent with very high-effective reflectivity (approaching unity). Because of the high index-of-refraction contrast in the SOI platform, this can be achieved with ultra-small device size. For example, for a typical single-mode ridge optical waveguide design, about 10 pairs of gratings (having a pitch of 300 nm) may provide more than 95% reflection to the incident optical field. Consequently, the total length of the straight optical waveguide (including the two distributed Bragg reflectors and the phase shifter) may be around 5-10 µm. This may provide an advantage if the hybrid laser is tunable. As shown in FIG. 2, with a built-in metal heater on top of the straight optical waveguide section, the chip temperature, and thus the lasing wavelength, can be changed by applying current through the thermal heater. For optimal tuning, several metal heater designs may be used depending on different processing platforms. For example, the metal heater may be a single-layer snaked metal trace on top of the filled-oxide using a thermally resistive metal, such as tungsten. Alternatively, in another CMOS-compatible process, the metal heater may be a multi-layer metal zigzag trace connected with metal vias to maximize the thermal resistance. Because of the extremely small footprint, this tuning mechanism may be very fast and may be power-efficient.

Furthermore, while the center optical waveguide section may have a slightly higher index of refraction, its length may need to be carefully designed so that it produces an additional 90° phase change when propagating from one distributed Bragg grating to the other. For an incident field in the optical waveguide at the resonant frequency of the resonator, a strong field may build up in the resonator optical cavity. The energy accumulated in the optical cavity may then be coupled back into the coupling optical waveguide in both directions. The re-injected field in the forward direction may destructively interfere with the incident field and, provided the resonator loss is dominated by optical coupling, at resonance essentially all the power may be reflected. Note that the optical coupling between the two side-by-side optical waveguides may be determined by the coupling gap (or the separation between optical waveguide 116 and reflector 120 in FIG. 2) and the coupling length. (For example, the coupling gap may be between 100 and 500 nm.) In most applications, where the gap between the two optical waveguides is controlled by the photolithography technique, the coupling coefficient may be determined by the coupling length. Consequently, beside the quarter-wave shift function, the length of this center section may also impact the energy-transfer ratio between the two optical waveguides. Optimization of the phase length may be a key design parameter for maintaining high Q for the narrow-band resonator, while still providing enough optical coupling to the output optical waveguide for the wavelength-feedback information.

Figure 4:
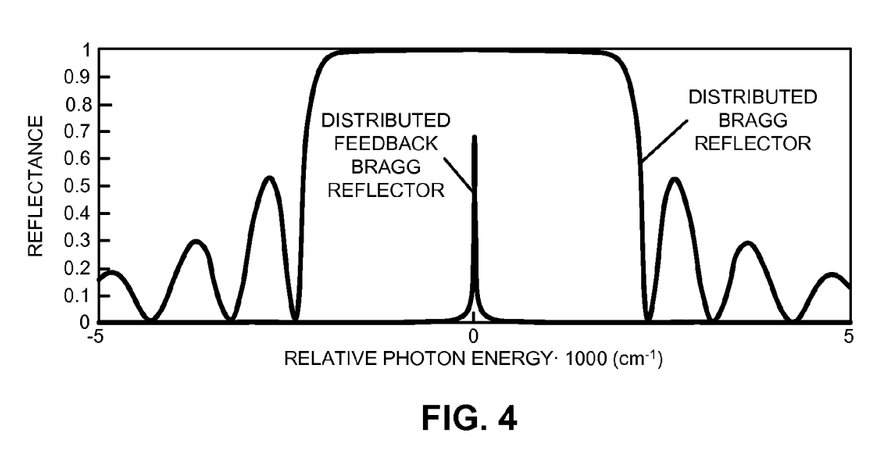
FIG. 4 is a graph illustrating reflectance spectra for a distributed Bragg reflector and a distributed feedback Bragg reflector in accordance with an embodiment of the present disclosure.

FIG. 4 presents a graph illustrating reflectance spectra for a distributed Bragg reflector and a distributed feedback Bragg reflector (viewed from the laser side). Similar to an FP resonator, there is a transmission peak at the resonance that results from the strong built-in internal field. When a side-coupled outlet is present, this peak transmission may then be transferred into an abrupt reflection resonance for the distributed feedback Bragg reflector. Depending on the end or edge reflections and the internal loss, the width of the resonance, which is also a measure of the Q of the optical cavity, may be designed to be very narrow (on the order of angstroms). As noted previously, it may take about 10 pairs of 300 nm-pitch gratings to boost the reflection of the distributed Bragg reflector to unity, so in an SOI platform high-end reflection may not be a problem. Although the scattering loss of these deep-etched distributed Bragg gratings may be high, the average optical-waveguide loss may not be bad because the distributed Bragg gratings are typically really short (with total lengths that are less than 10 µm). Therefore, the side-coupled distributed feedback Bragg reflector may be applied to many SOI platforms by providing ultra-narrow wavelength feedback with a much larger FSR (greater than 70 nm). This narrow width of the reflection peak may give rise to significant line narrowing in the hybrid laser.

As noted previously, even though the edges (or the interfaces of integration) are AR coated to eliminate the FP effect, in order for the hybrid laser to achieve the narrowest linewidth, the external optical-cavity mode may still need to be aligned with the side-coupled distributed feedback Bragg reflector spectrum. However, the index of refraction of the optical amplifier may drift because of chip temperature variation associated with bias-current changing and device aging. Consequently, wavelength stabilization is typically needed in order to compensate for the temperature-changing factors. One solution to this problem is to use a cladding material having an index of refraction with a temperature dependence that is opposite to that of the gain material. Because the index of refraction of the active region increases with temperature, it has a positive thermal-optical (TO) coefficient of $1.86 \times 10^{-4}$ $K^{-1}$. Titanium dioxide ($TiO_2$) has a negative TO coefficient and is CMOS-compatible. For example, depending on the film quality, the TO coefficient of titanium dioxide can be as low as $-2.15 \times 10^{-4}$ $K^{-1}$. Furthermore, because of the high confinement of typical silicon optical waveguides, an optical waveguide covered by a material having a negative TO coefficient may have a reduced lateral dimension or width to allow for more optical-mode overlap with the cladding. As shown FIG. 2, two tapers 140 (such as inverse tapers) may be implemented before and after the narrowed optical-waveguide region or portion for a smooth (adiabatic) optical-waveguide transition. For example, tapers 140 may each change the width of the optical waveguide from 400 nm to 200 nm over a distance of tens of microns. Additionally, because the optical wave travels through both materials (silicon and titanium dioxide), the temperature-induced changes in the index of refraction may cancel each other with proper design. Thus, it is possible to make the optical amplifier insensitive to the temperature change, and to keep the overall phase change for the hybrid laser to a minimum. While the preceding discussion had a titanium dioxide cladding over a silicon core in the temperature-sensitive element, note that in some embodiments the temperature-sensitive element only includes titanium dioxide (or a material with a negative TO coefficient).

In summary, this disclosure provides an extremely narrow bandwidth athermal hybrid silicon laser design with a side-coupled distributed feedback Bragg reflector. This silicon distributed feedback Bragg reflector in the hybrid laser may be very compact and can be applied to many SOI platforms. Moreover, the distributed feedback Bragg reflector may provide ultra-narrow wavelength feedback to the hybrid optical cavity, and the FSR may be much larger than the 3 dB photoluminescence bandwidth of the gain medium in the optical amplifier. Furthermore, the distributed feedback Bragg reflector may be tuned using a built-in metal heater without significant power consumption. When integrated with titanium dioxide or another material with a negative TO coefficient covering a narrow optical waveguide, it is possible to minimize temperature-related mode-hopping phenomena, and to realize athermal laser operation without cooling or, more generally, temperature regulation.

Figure 5:
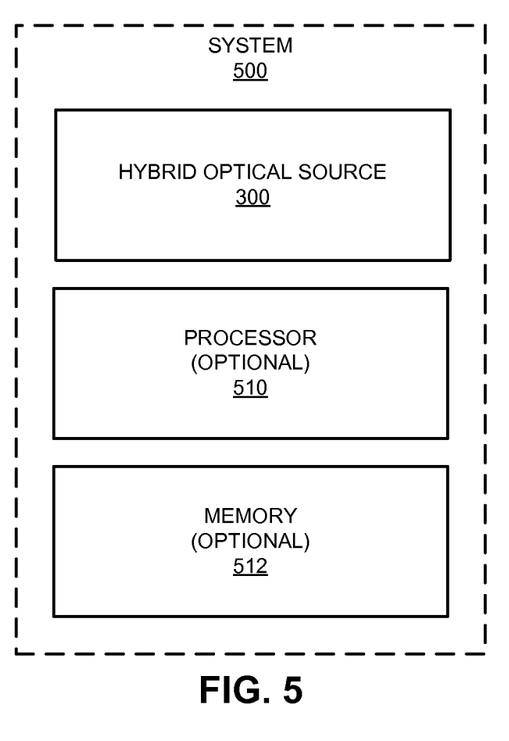
FIG. 5 is a block diagram illustrating a system that includes the hybrid optical source of FIG. 3 in accordance with an embodiment of the present disclosure.

We now describe the system. FIG. 5 presents a block diagram illustrating a system 500 that includes: hybrid optical source 300, an optional processor 510, and optional memory 512.

Note that hybrid optical source 300 can be used as an external optical source to provide optical power to a silicon photonic chip, a silicon-photonic interconnect or link, or an optical fiber. More generally, hybrid optical source 300 can be used in a wide variety of applications, including communications, welding, medicine, etc. Consequently, system 500 may include: a VLSI circuit, a switch, a hub, a bridge, a router, a communication system, a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a workstation, a mainframe computer, a blade, an enterprise computer, a data center, a portable-computing device, a tablet computer, a supercomputer, a network-attached-storage (NAS) system, a storage-area-network (SAN) system, and/or another electronic computing device. In some embodiments, the computer system may be at one location or may be distributed over multiple, geographically dispersed locations.

Moreover, the preceding embodiments of the hybrid optical source and/or the system may include fewer components or additional components. Moreover, the substrates may include: a semiconductor die (such as silicon), a ceramic, an organic material and/or glass.

Although the hybrid optical source and the system are illustrated as having a number of discrete items, these embodiments are intended to be functional descriptions of the various features that may be present rather than structural schematics of the embodiments described herein. Consequently, in these embodiments, two or more components may be combined into a single component and/or a position of one or more components may be changed. In addition, functionality in the preceding embodiments may be implemented more in hardware and less in software, or less in hardware and more in software, as is known in the art.

Note that components in the preceding embodiments of the hybrid optical source and the system may be fabricated using a wide variety of techniques, as is known to one of skill in the art.

Figure 6:
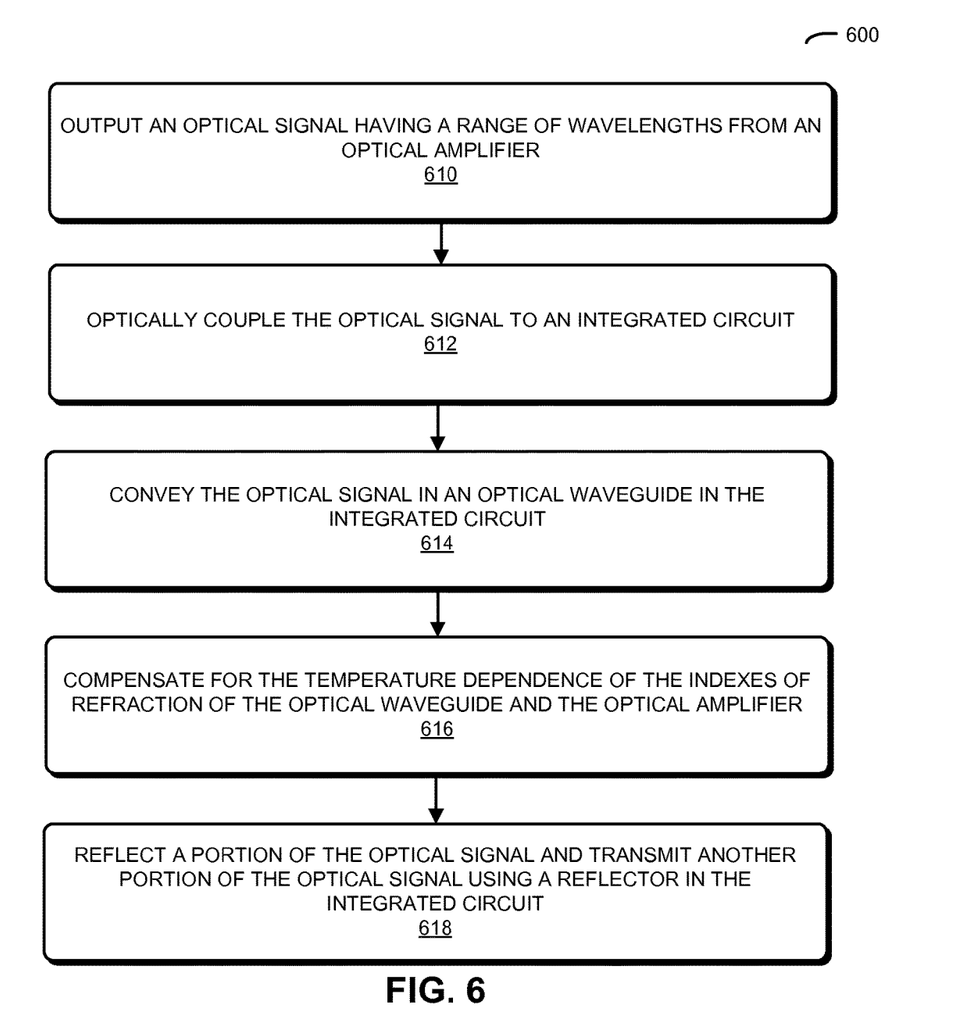
FIG. 6 is a flow diagram illustrating a method for providing an optical signal having a wavelength in accordance with an embodiment of the present disclosure.

We now describe embodiments of the method. FIG. 6 presents a flow diagram illustrating a method 600 for providing an optical signal having a wavelength, which may be performed by hybrid optical source 300 (FIG. 3). During operation, the optical amplifier outputs the optical signal having a range of wavelengths (operation 610). This optical signal is optically coupled to the integrated circuit (operation 612). Then, the optical waveguide in the integrated circuit conveys the optical signal (operation 614). Moreover, the temperature-compensation element in the integrated circuit compensates for the temperature dependence of the indexes of refraction of the optical waveguide and the optical amplifier (operation 616), where the temperature-compensation element is included in a portion of the optical waveguide. Furthermore, a reflector, adjacent to the optical waveguide and after the temperature-compensation element in the integrated circuit, reflects a portion of the optical signal and transmits another portion of the optical signal (operation 618), where the portion and the other portion have the wavelength.

In some embodiments of method 600, there may be additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An integrated circuit, comprising:
    a substrate;
    a buried-oxide layer disposed on the substrate;
    a semiconductor layer disposed on the buried-oxide layer, wherein the semiconductor layer includes:
        an optical waveguide, having a first edge and a second edge, configured to convey an optical signal;
        a reflector, optically coupled to the optical waveguide between the first edge and the second edge, configured to reflect a portion of the optical signal and transmit another portion of the optical signal; and
        a temperature-compensation element, optically coupled to the optical waveguide between the first edge and the second edge, configured to compensate for a temperature dependence of an index of refraction of the optical waveguide; and
    an optical amplifier, having a third edge and a fourth edge, configured to provide the optical signal, wherein the third edge is optically coupled to the first edge;
    wherein the optical amplifier includes another reflector optically coupled to the fourth edge; and
    wherein the optical amplifier is disposed on another substrate that is different than the substrate.

2. The integrated circuit of claim 1, wherein the reflector includes a distributed feedback Bragg reflector having two distributed Bragg reflectors separated by another optical waveguide with an optical path length that provides a phase shift of one-quarter of a fundamental wavelength of the optical signal.

3. The integrated circuit of claim 1, wherein the integrated circuit further includes a heater, thermally coupled to the reflector, configured to thermally tune the reflector.

4. The integrated circuit of claim 1, wherein the reflector is side-coupled to the optical waveguide.

5. The integrated circuit of claim 1, wherein the temperature-compensation element is included in a portion of the optical waveguide.

6. The integrated circuit of claim 5, wherein the optical waveguide has a narrower width in the portion than in a remainder of the optical waveguide.

7. The integrated circuit of claim 5, wherein the portion includes a titanium dioxide cladding layer.

8. The integrated circuit of claim 1, wherein the optical coupling of the third edge and the first edge includes one of: edge coupling and vertical coupling.

9. The integrated circuit of claim 1, wherein the temperature-compensation element is further configured to compensate for a temperature dependence of an index of refraction of the optical amplifier.

10. The integrated circuit of claim 1, wherein the other substrate includes a III-V semiconductor.

11. The integrated circuit of claim 1, wherein the other reflector includes a mirror.

12. The integrated circuit of claim 1, wherein the substrate includes silicon, the buried-oxide layer includes silicon dioxide, and the semiconductor layer includes silicon.

13. A hybrid optical source, comprising:
an integrated circuit, wherein the integrated circuit includes:
a substrate;
a buried-oxide layer disposed on the substrate; and
a semiconductor layer disposed on the buried-oxide layer, wherein the semiconductor layer includes:
an optical waveguide, having a first edge and a second edge, configured to convey an optical signal;
a reflector, optically coupled to the optical waveguide between the first edge and the second edge, configured to reflect a portion of the optical signal and transmit another portion of the optical signal; and
a temperature-compensation element, optically coupled to the optical waveguide between the first edge and the second edge, configured to compensate for a temperature dependence of indexes of refraction of the optical waveguide and of an optical amplifier; and
the optical amplifier, having a third edge and a fourth edge, configured to provide the optical signal, wherein the third edge is optically coupled to the first edge;
wherein the optical amplifier includes another reflector optically coupled to the fourth edge; and
wherein the optical amplifier is disposed on another substrate that is different than the substrate.

14. The hybrid optical source of claim 13, wherein the reflector includes a distributed feedback Bragg reflector having two distributed Bragg reflectors separated by another optical waveguide with an optical path length that provides a phase shift of one-quarter of a fundamental wavelength of the optical signal.

15. The hybrid optical source of claim 14, wherein the integrated circuit further includes a heater, thermally coupled to the reflector, configured to thermally tune the reflector.

16. The hybrid optical source of claim 13, wherein the temperature-compensation element is included in a portion of the optical waveguide;
wherein the optical waveguide has a narrower width in the portion than in a remainder of the optical waveguide; and
wherein the portion includes a titanium dioxide cladding layer.

17. The hybrid optical source of claim 13, wherein the other substrate includes a III-V semiconductor.

18. The hybrid optical source of claim 13, wherein the substrate includes silicon, the buried-oxide layer includes silicon dioxide, and the semiconductor layer includes silicon.

* * * * *

UNITED STATES PATENT AND TRADEMARK OFFICE
CERTIFICATE OF CORRECTION

PATENT NO. : 9,638,858 B2  
APPLICATION NO. : 14/451105  
DATED : May 2, 2017  
INVENTOR(S) : Luo et al.

Page 1 of 1

It is certified that error appears in the above-identified patent and that said Letters Patent is hereby corrected as shown below:

On the Title Page

On page 2, Column 1, item (56), under Other Publications, Line 15, delete "ioxide"" and insert -- dioxide" --, therefor.

Signed and Sealed this
Thirty-first Day of October, 2017

Joseph Matal
*Performing the Functions and Duties of the*
*Under Secretary of Commerce for Intellectual Property and*
*Director of the United States Patent and Trademark Office*